United States Patent
Beards et al.

[11] Patent Number: 5,920,235
[45] Date of Patent: Jul. 6, 1999

[54] VOLTAGE CONTROLLED OSCILLATOR INTEGRATED CIRCUIT

[75] Inventors: Ronald Douglas Beards, Mountain; Samuel Alfred Tiller, Ottawa, both of Canada

[73] Assignee: Northern Telecom Limited, Montreal, Canada

[21] Appl. No.: 08/882,577

[22] Filed: Jun. 25, 1997

[51] Int. Cl.⁶ .................................................. H03B 7/00
[52] U.S. Cl. ................. 331/108 D; 331/115; 331/117 R; 331/177 V; 331/167; 331/132
[58] Field of Search ............ 331/177 V, 117 R, 331/115, 132, 167, 108 D

[56] References Cited

U.S. PATENT DOCUMENTS 5,434,543   7/1995   Brizka et al. ...................... 331/117 R

FOREIGN PATENT DOCUMENTS 0995260   2/1983   U.S.S.R. ................................ 331/115

OTHER PUBLICATIONS

Grebene, "Bipolar and MOS Analog Integrated Circuit Design", pp. 571–575; 1984, John Wiley, Integrated–Circuit Oscillators and Timers.

Goyal, "High–Frequency Analog Integrated Circuit Design", pp. 312–318, 1995, John Wiley, Mixers and Oscillators.

Jansen et al, "Silicon Bipolar VCO Family for 1.1 to 2.2GHz with Fully–Integrated Tank and Tuning Circuits", IEEE ISSCC '97 Proceedings, pp. 392–396, Session 23/Analog Techniques/Paper SP 23.8.

Dawe et al, A 2.7V DECT RF Transceiver with Integrated VCO', IEEE ISSCC'97/Session 18/Wireless Transceivers and Receivers/Paper SA 18.5; pp. 308–308–309.

*Primary Examiner*—Arnold Kinkead

[57] ABSTRACT

A voltage controlled oscillator has a cross-coupled negative resistance cell formed as an integrated circuit connected to off-chip components of a high-Q resonant tank circuit. To counteract spurious oscillations brought about by package parasitics caused by the interconnection of the chip to the external components, the cell is provided with a degeneration impedance. Typically, a pure inductor is used if all the elements of the tank circuit are off-chip. In a case where the tank circuit includes an on-chip fixed capacitor, the degeneration impedance may take the form of a capacitor.

6 Claims, 3 Drawing Sheets

VOLTAGE CONTROLLED OSCILLATOR INTEGRATED CIRCUIT

FIELD OF THE INVENTION

This invention relates to voltage controlled oscillators (VCOs) and, in particular, VCOs manufactured using integrated circuit (IC) technology.

BACKGROUND OF THE INVENTION

A voltage controlled oscillator is commonly constructed using a cross-coupled negative resistance cell 10 and a resonant tank circuit 11 as shown in FIG. 1. The output conductance of the cross-coupled cell alone may be expressed approximately by the following equation which is valid over a very broad frequency range:

$$G_O = -gm/2 \quad (1)$$

where gm is the transconductance of either transistor in the cross-coupled cell.

The fact that the output conductance is negative will, in general, guarantee oscillations at any frequency for which the resonant tank presents a conductance with a smaller magnitude (thus resulting in a net negative conductance). The amplitude of the oscillations, at a given frequency, will be proportional to the magnitude of the resonator complex impedance at that frequency. The purpose of the resonant tank then is to present the negative resistance cell with both a small conductance (usually over a very broad frequency range), and a large complex impedance (usually over a narrow band of frequencies, the centre of which is controlled by varying the value of the resonator capacitance through an external control voltage).

The primary performance criterion for a VCO is the phase noise expressed by the following equation:

$$N/S_{\Delta f} = \frac{|ELG|}{8(Q\cos\phi)^2}\left(\frac{f_0}{\Delta f}\right)^2\left(\frac{V_n}{V_s}\right)^2 \quad (2)$$

where ELG is the excess loop gain,

Q is the resonator Q $\phi$ is voltage-current phase delay $f_0$ is center frequency of oscillation $\Delta f$ is frequency offset from center $V_n$ is tank-referred noise voltage $V_s$ is tank-referred signal From Equation (2) it is apparent that to minimize the phase noise it is desirable to obtain a high-Q resonant tank circuit. (The Q of the tank is defined as the ratio of the susceptance of either reactive component at resonance to the net conductance of the tank). Typical integrated circuit (IC) technologies do not in general allow the realization of high-Q components on the chip, and so it is common to make use of external, high-Q elements such as inductors and voltage-variable capacitors (varactors) which are connected to the negative resistance cell through the IC bond pads, bond wires, package leads and board traces, as shown in FIG. 2. These so-called board and package parasitics 12 (hereinafter referred to simply as package parasitics) result in spurious resonances (frequencies at which the tank impedance is high) which can cause the VCO to oscillate at frequencies other than the intended frequency.

Typically, elaborate and costly packaging and/or IC processing techniques, or the use of lower-Q (and hence noisier) external or internal tank circuits are required to overcome the problem of spurious oscillations in the design of such IC VCOs.

SUMMARY OF THE INVENTION

It is an object of the present invention to provide a VCO formed with an IC cross-coupled negative resistance cell and a high-Q resonant tank circuit at least part of which is external (off-chip) in which spurious oscillation caused by package parasitics is greatly reduced or eliminated.

According to the invention, there is provided a voltage controlled oscillator comprising an integrated circuit on-chip cross-coupled negative resistance cell coupled to a high-Q resonant tank circuit at least part of which is off-chip, wherein a degeneration impedance is provided in the negative resistance cell to increase the magnitude of the negative resistance presented to the off-chip tank circuit at frequencies other than the desired resonant frequency of the tank circuit and thereby reduce spurious oscillations due to package parasitics.

In a preferred embodiment, the degeneration impedance is purely reactive because resistance elements tend to degrade phase noise.

More particularly, the invention provides a voltage controlled oscillator comprising an integrated circuit on-chip cross-coupled negative resistance cell coupled to a high-Q resonant tank circuit, wherein the resonant tank circuit comprises an on-chip capacitor and an off-chip portion, and wherein a degeneration capacitor is provided in the negative resistance cell to increase the magnitude of the negative resistance presented to the tank circuit at frequencies other than the resonant frequency of the tank circuit and thereby reduce spurious oscillations due to package parasitics.

BRIEF DESCRIPTION OF THE DRAWINGS

Preferred embodiments of this invention will now be described with reference to the attached drawings in which.

DETAILED DESCRIPTION OF THE PREFERRED EMBODIMENTS

The drawings are all simplified schematics in which the transistor emitter bias is illustrated with a bias current source but the dc bias current supplies to the collectors and bases are not shown.

Figure 2:
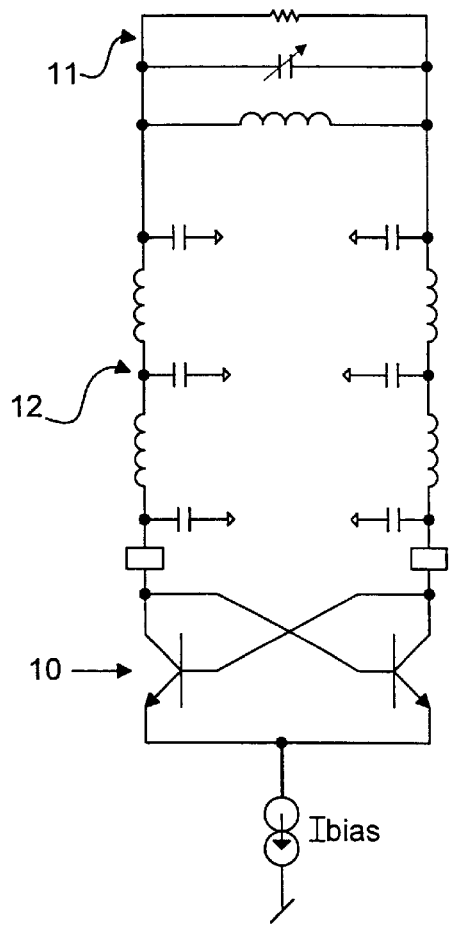
FIG. 2 is a simplified schematic of a conventional IC VCO in which the resonant tank circuit is off-chip and showing the package parasitics.
Figure 3:
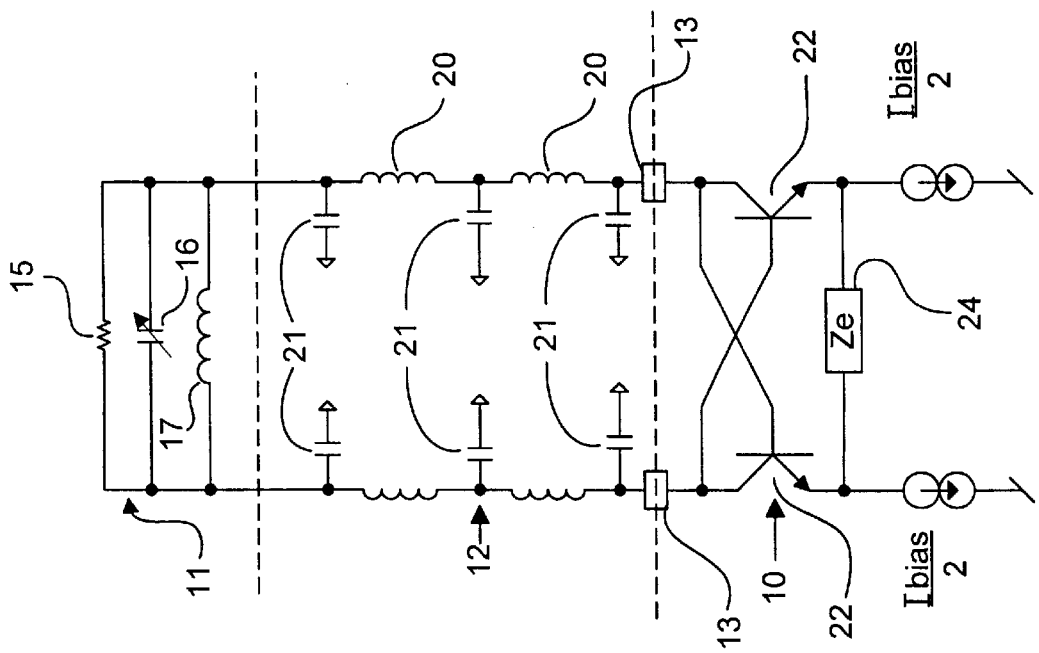
FIG. 3 is a simplified schematic of an IC VCO constructed according to the invention.

Referring to FIG. 3, this is similar in configuration to FIG. 2 and comprises an on-chip IC negative resistance cell 10 connected to an off-chip resonant tank circuit 11. The external tank circuit is connected with the on-chip cell 10 by means of bond pads 13 as well as bond wires, package leads and board traces (not specifically illustrated). The bond pads, bond wires, package leads and board traces together give rise to the package parasitics the equivalent circuit of which is referenced 12.

The external tank circuit 11 typically comprises a voltage variable capacitor (varactor) 16 and an inductor 17 connected in parallel. Parasitic resistance in the non-ideal varactor and inductor is illustrated as a parallel resistor 15.

The package parasitics 12 may be represented by several series connected inductors 20 and several capacitors 21 leaking to ground.

Figure 1:
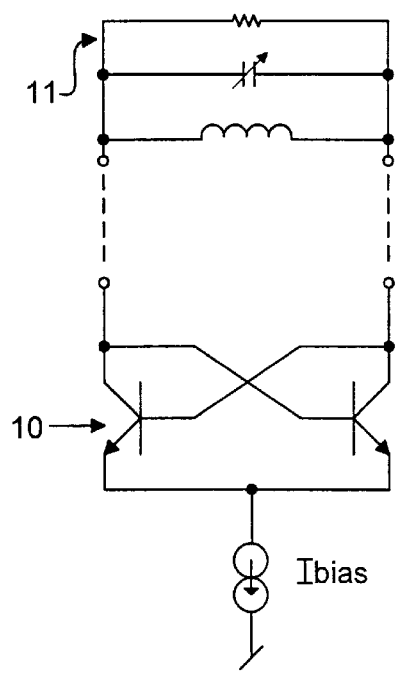
FIG. 1 is a simplified schematic of a conventional negative resistance VCO.

The negative resistance cell is conventional in that it comprises two transistors 22 with the base of each being connected to the collector of the other. However, instead of a direct connection between the emitters as in FIGS. 1 or 2, a degeneration (negative feedback) impedance 24 is connected between the two emitters. Inclusion of this impedance modifies the output conductance of the cross-coupled pair from that given in Equation (1) to the form $$G_0 = -Re(2/gm + Ze(f))^{-1} \qquad (3)$$

where Re is the real operator and Ze(f) is the complex, frequency-dependent value of the degeneration impedance Ze connected between the emitters. Inspection of Equation (3) reveals that at frequencies where Ze(f) is large, the value of $G_0$ is small and the VCO will not oscillate if loaded with a tank having a parasitic conductance larger than the value given by Equation (3), even if the tank is resonant at those frequencies, because the net conductance will be positive. Conversely, at frequencies where Ze(f) is small, the magnitude of $G_0$ becomes large and the VCO will oscillate when loaded with a tank having a parasitic conductance that is smaller than the value given by Equation (3), because the net conductance will be negative. Thus one can choose a frequency-dependent degeneration impedance Ze that ensures oscillation at the intended frequency but prevents it from occurring at any undesired frequencies. While the impedance typically may consist of a combination of reactive elements (inductors and capacitors) and may include some resistance, it is to be noted that resistors are less desirable since they degrade phase noise by contributing to the $V_n$ term in Equation 2.

A specific example of a degeneration impedance would be an inductor, used in the place of Ze in FIG. 3. In this case, $Ze(f) = j2\pi fL$ and Equation (3) becomes $$G_0 = -Re(2/gm + j2\pi fL)^{-1} \qquad (4)$$

where j is the complex operator, f is the frequency and L is the value of the inductance. Examination of Equation (4) reveals that the magnitude of $G_0$ is small (and hence the VCO is less likely to oscillate) at high frequencies, while the magnitude of $G_0$ becomes large (and the VCO is more likely to oscillate) at low frequencies. Thus, the high frequency parasitic resonance associated with the tank in FIG. 3 can be overcome.

An added benefit of the invention is that it also reduces phase noise through reduction of the ELG term in Equation 2.

Figure 4:
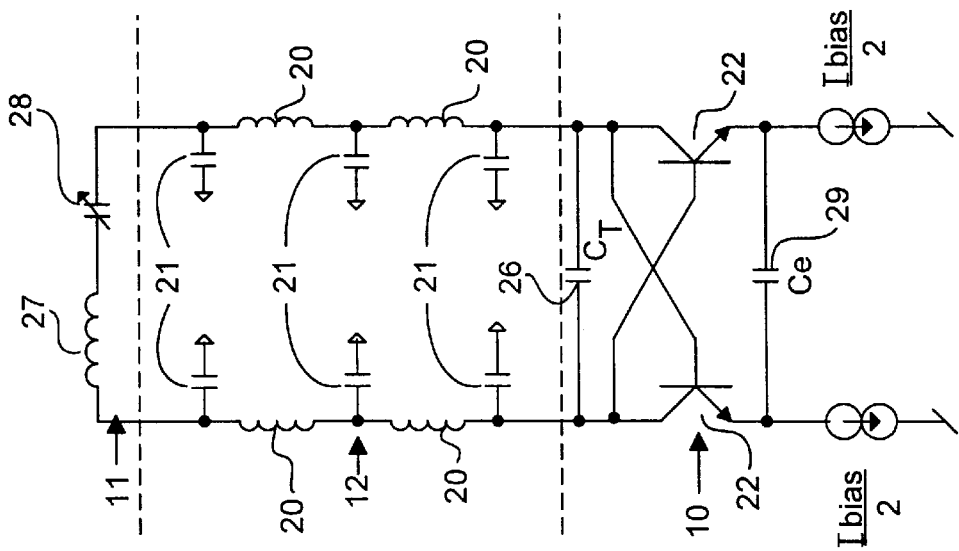
FIG. 4 is a simplified schematic of an IC VCO illustrating a variant of the invention.

FIG. 4 shows a variation of the invention in which part of the resonant tank circuit is formed on the chip. This part is a fixed capacitor 26 which is connected across the collectors of the two transistors 22 of the negative resistance cell. The rest of the tank circuit comprises an inductor 27 connected in series with a varactor 28. It is noted that using typical IC technologies a fixed capacitor can be constructed on-chip with high-Q. The advantage of the form of tank circuit used here is that the package parasitics no longer result in a high frequency spurious resonance. The series combination of external inductor and varactor does however generate a high resonator impedance at low frequencies which would result in spurious low frequency oscillations. This is taken care of in FIG. 4 by using a capacitor 29 as the degeneration impedance. This is illustrated in the following example relating to a VCO of the type depicted in FIG. 4 and intended to oscillate at 1000 MHz. A typical value for the parasitic shunt conductance of the tank in such a VCO might be 0.001 S. Biasing the transistors in the cross-coupled pair to yield an output conductance, given by Equation (1), of, for example, −0.004 S, will result in a net conductance for the cross-coupled pair and the tank of −0.003 S, and thus will guarantee oscillations of significant amplitude whenever the tank is resonant. Typical tank and parasitic component values that would result in a desired 1000 MHz resonance would also result in an undesired resonance at about 100 MHz. Thus one would choose a degeneration impedance which is small in magnitude at 1000 MHz but large in magnitude at 100 MHz. Such an impedance is a capacitor, which has an impedance $Ze(f) = 1/j2\pi fC$, where C is the capacitance, j is the complex operator, and f is the frequency. Using this in Equation (3), and where 2/gm is given above as 1/0.004 ohms, one can choose a value for C by setting Equation (3) to be much smaller in magnitude than the parasitic conductance of the tank at the frequency of the parasitic resonance (thus ensuring a positive net conductance there, and preventing oscillations). Setting Equation (3) equal to −0.0002 S at 100 MHz and solving for C, one obtains a value of C=1.5 pF. Using this value in Equation (3) at 1000 MHz yields a value of $G_0$=−0.003 S which is still sufficient to ensure oscillation when shunted with the 0.001 S parasitic conductance of the tank. Thus a degeneration impedance consisting of a 1.5 pF capacitor used as shown in FIG. 4 in a VCO of that form can ensure proper oscillation at a desired frequency of 1000 MHz while preventing otherwise inherent low-frequency spurious oscillations from occurring.

Figure 5:
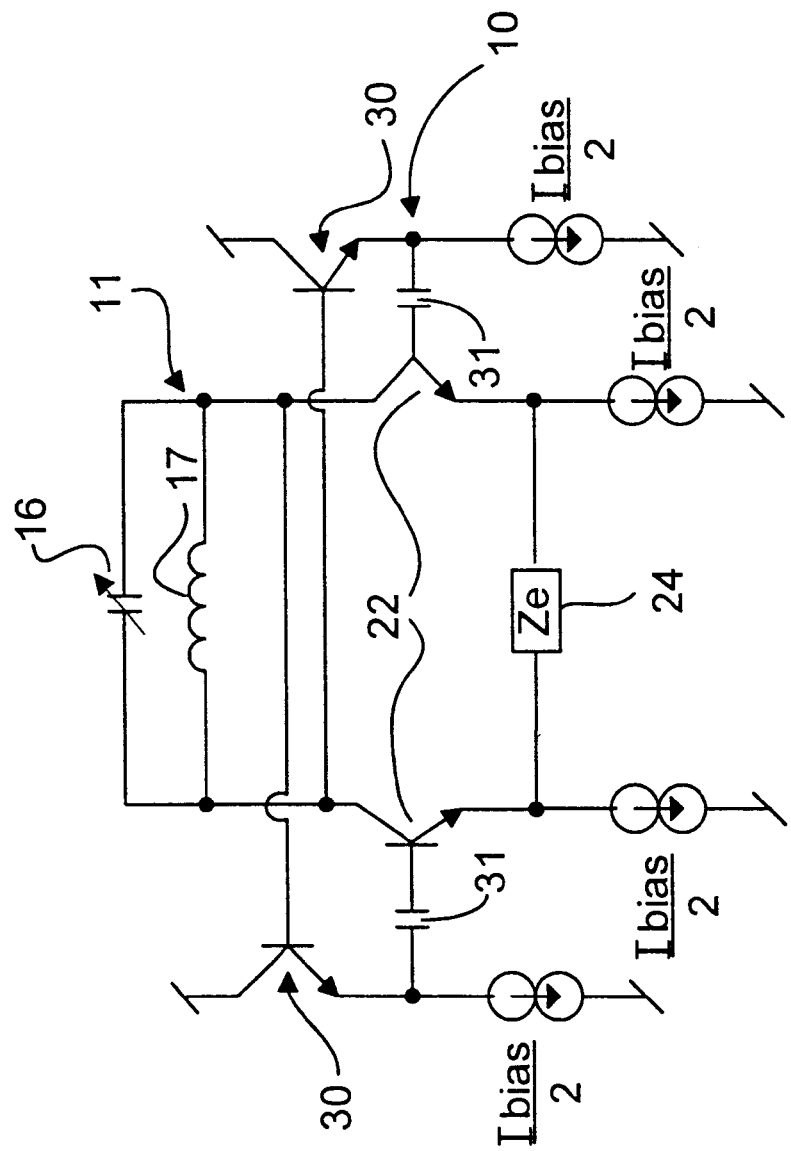
FIG. 5 is a simplified schematic of an IC VCO constructed according to the invention but including a common form of enhancement.

FIG. 5 shows a common enhancement to all VCOs of the negative resistance cell variety, and which is to be considered within the ambit of this invention. Emitter follower buffer transistors 30 (with or without capacitive coupling 31 as shown) are added to enhance the dynamic behaviour of the VCO. The package parasitics are not illustrated in FIG. 5. Many other enhancements to the basic VCO structure are also possible, while the basis of the invention remains the use of the degeneration impedance in the general form shown in FIG. 3.

Although the negative resistance cell is illustrated using bipolar junction transistors, the invention is not limited to the particular type of transistor used and FET's, for example, could be substituted.

We claim:

1. A voltage controlled oscillator comprising an integrated circuit on-chip cross-coupled negative resistance cell coupled to a high-Q resonant tank circuit, wherein the resonant tank circuit comprises an on-chip capacitor and an off-chip portion, and wherein a degeneration capacitor is provided in the negative resistance cell to increase the magnitude of the negative resistance presented to the tank circuit at frequencies other than the resonant frequency of the tank circuit and thereby reduce spurious oscillations due to package parasitics.

2. A voltage controlled oscillator according to claim 1, wherein the off-clip portion of the tank circuit comprises an inductor connected in series to a varactor, the inductor and varactor being connected in parallel with the on-chip capacitor of the tank circuit.

3. A voltage controlled oscillator according to claim 1, wherein the cross-coupled negative resistance cell is formed of two cross-coupled bipolar transistors.

4. A voltage controlled oscillator according to claim 3, wherein the transistors each have a base, emitter and collector with the base of each transistor coupled to the collector of the other transistor and wherein the degeneration capacitor is connected across the emitters of the two transistors.

5. A voltage controlled oscillator according to claim 1, wherein the cross-coupled negative resistance cell is formed of two cross-coupled bipolar transistors and two emitter follower bipolar transistors, each of the transistors having a transistor being connected to the emitter of a respective one of the emitter follower transistors, and the collector of each cross-coupled transistor being connected to the base of the other one of the emitter follower transistors, and wherein the degeneration capacitor is connected across the emitters of the two cross-coupled transistors.

6. A voltage controlled oscillator according to claim 1 wherein the cross-coupled negative resistance cell is formed of two cross-coupled FET's.

* * * * *

UNITED STATES PATENT AND TRADEMARK OFFICE
CERTIFICATE OF CORRECTION

PATENT NO. : 5,920,235
DATED : 07/06/99
INVENTOR(S) : RONALD DOUGLAS BEARDS and SAMUEL ALFRED TILLER It is certified that error appears in the above-identified patent and that said Letters Patent is hereby corrected as shown below:

Column 4, line 67 (Claim 2): change "off-clip" to "off-chip"

Column 6, between line 2 and 3 (Claim 5): insert the following missing text "base, emitter and collector, the base of each cross-coupled"

Signed and Sealed this

Twenty-ninth Day of February, 2000

*Attest:*

Q. TODD DICKINSON

*Attesting Officer*  *Commissioner of Patents and Trademarks*